(12) United States Patent
Cruzan et al.

(10) Patent No.: US 7,661,276 B1
(45) Date of Patent: Feb. 16, 2010

(54) EVAPORATOR

(75) Inventors: Gregory Cruzan, Anaheim, CA (US); Frank Landon, Santa Ana, CA (US)

(73) Assignee: EADS North America, Inc., Irvine, CA (US)

( * ) Notice: Subject to any disclaimer, the term of this patent is extended or adjusted under 35 U.S.C. 154(b) by 430 days.

(21) Appl. No.: 11/451,036

(22) Filed: Jun. 12, 2006

(51) Int. Cl.
 *F25B 39/02* (2006.01)
(52) U.S. Cl. .......................................... 62/515; 62/304
(58) Field of Classification Search .................... 62/515, 62/304; 165/80.4
 See application file for complete search history.

(56) References Cited

U.S. PATENT DOCUMENTS 6,476,627 B1 11/2002 Pelissier et al.
6,668,570 B2 12/2003 Wall et al.
6,993,922 B2 2/2006 Wall et al.
7,017,358 B2 3/2006 Wayburn et al.
2007/0272392 A1* 11/2007 Ghosh et al. ............... 165/80.4

* cited by examiner

*Primary Examiner*—Melvin Jones

(57) ABSTRACT

An evaporator (102) provides a compact design in which thermal energy can be removed from a DUT (108) in an efficient manner. The evaporator (102) can include a cover (306) which includes both input and output apertures for providing refrigerant into and out of the evaporator (102). An orifice plate (304) is located between the cover (306) and a heat exchanger (302). The heat exchanger (302) includes a plurality of pillars which help increase the surface area of the heat exchanger (302). The orifice plate (304) includes an aperture (310) which forms a nozzle which sprays refrigerant onto the heat exchanger in order to remove the heat away from the heat exchanger (302).

19 Claims, 4 Drawing Sheets

EVAPORATOR

FIELD OF THE INVENTION

The invention relates in general to heat dissipation devices and more particularly to an evaporator for use in dissipating heat from electronic devices that are undergoing testing.

BACKGROUND

Modern electronic devices such as high-speed microprocessors, power amplifiers and laser diodes generate large amounts of thermal energy in the form of heat when in operation. Designing a test system to test a large volume of electronic devices that dissipate a large amount of heat in a timely fashion is not an easy task since the heat generated by the electronic device-under-test (DUT) has to be removed or minimized in a timely fashion in order to properly test the DUT, while at the same time minimizing the size of the test/cooling system in order to conserve floor space.

BRIEF DESCRIPTION OF THE DRAWINGS

The features of the present invention, which are believed to be novel, are set forth with particularity in the appended claims. The invention may best be understood by reference to the following description, taken in conjunction with the accompanying drawings, in the several figures of which like reference numerals identify like elements, and in which:

DETAILED DESCRIPTION

Figure 1:
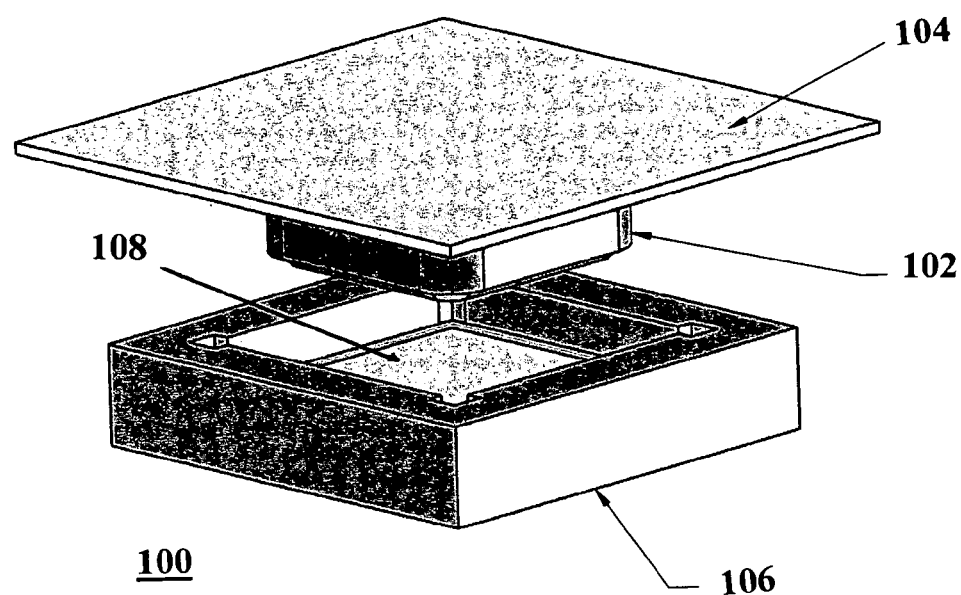
FIG. 1 shows a portion of a test assembly including a DUT and evaporator for removing the heat from the DUT in accordance with an embodiment of the invention.

While the specification concludes with claims defining the features of the invention that are regarded as novel, it is believed that the invention will be better understood from a consideration of the following description in conjunction with the drawing figures.

Referring now to FIG. 1 there is shown a portion of a test assembly 100 including a test socket 106 for receiving a Device-Under-Test (DUT) 108 such as an integrated circuit (IC) semiconductor or other electronic device that requires testing. Although not shown, the DUT 108 is placed in the test socket 106 using conventional pick-and-place equipment which is well known in the art. The test assembly further includes an evaporator 102 coupled to a refrigerant distribution manifold 104. The evaporator 102 may be attached to the manifold using conventional fasteners such as screws. A gasket (not shown) is placed between the evaporator 102 and distribution manifold 104 in order to seal the refrigerant inputted into the evaporator 102. In one embodiment of the invention, the refrigerant provided to the evaporator 102 is liquid R-134a Freon, although other refrigerants may be used.

In operation, once a DUT 108 is placed in the test socket 106 the evaporator 102 is lowered and placed in thermal contact with the evaporator 102. In one embodiment, a compressible material having a high thermal conductivity coefficient which can transfer heat readily attached to the bottom of the evaporator 102 so that a tight fit is achieved between the DUT 108 and evaporator 102 in order for heat to flow easily from the DUT 108 to the heat exchanger 302. Once testing of the DUT 108 begins and the DUT starts generating heat, the liquid Freon being passed through the evaporator absorbs the heat and causes the liquid Freon to convert instantly into a gas which is outputted from the evaporator 102. By transferring heat away from the DUT 108 allows proper testing of the DUT 108 since the DUT 108 is allowed to stay within its operational thermal limits which prevent damaging the DUT 108 while it is undergoing testing.

Figure 2:
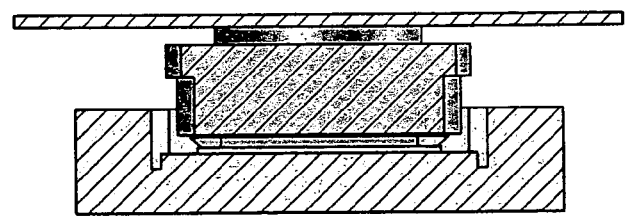
FIG. 2 shows a cross-sectional view of the test assembly shown in FIG. 1 in accordance with an embodiment of the invention.

In FIG. 2, there is shown a cross-sectional view of the evaporator 102 in thermal contact with the DUT 108. Once the testing of the DUT 108 is completed, the evaporator 102 is raised and the DUT 108 is removed from the testing socket 106. A new DUT 108 is then placed in the testing socket 106 and the entire testing process is repeated.

Figure 3:
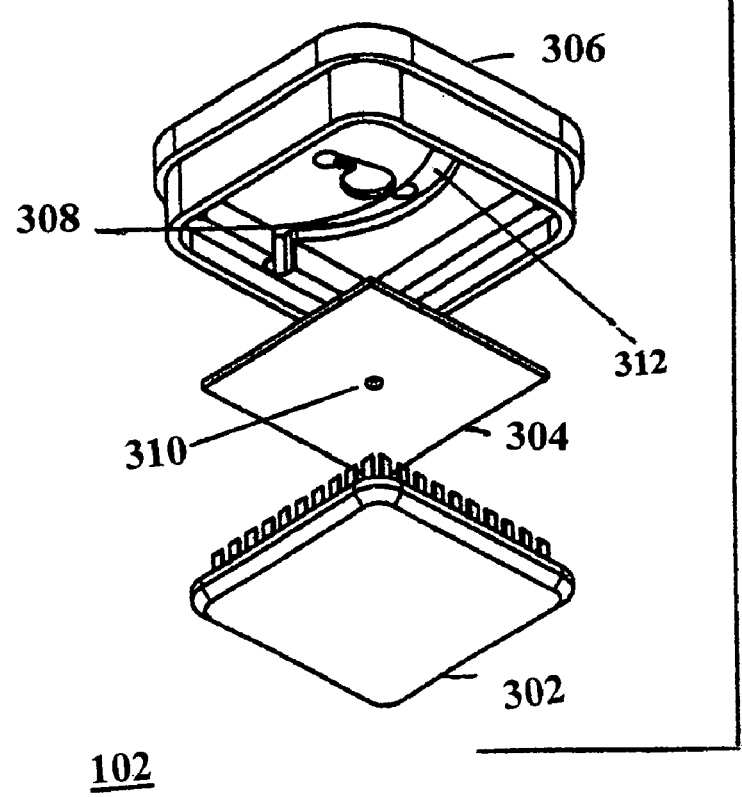
FIG. 3 shows an exploded of an evaporator in accordance with an embodiment of the invention.

An exploded view of the evaporator 102 is shown in FIG. 3. The evaporator 102 is comprised of a cover 306, an orifice plate 304 and a heat exchanger 302. In one embodiment, each of the pieces of the evaporator 102 is formed from copper or other material having high thermal conductivity. The orifice plate 304 is brazed to the heat exchanger 302 and the cover 306 is then brazed to the heat exchanger 302 in order to form a sealed evaporator. Other attachment techniques such as welding can also be used to attach the individual pieces together.

The orifice place 304 has a nozzle aperture 310 which in one embodiment has a precision double bevel which causes the liquid refrigerant sent via an input aperture 308 to form a controlled spray or misting pattern onto the heat exchanger 302. Since the heat exchanger 302 is very hot while the DUT 108 is undergoing testing, once the refrigerant mist hits the heat exchanger 302 the liquid refrigerant is immediately turned into gas allowing for the transfer of heat away from the heat exchanger 102 and thus away from the DUT 108. The refrigerant in the gaseous state leaves the evaporator 102 via the side edges of the orifice place and then via an output aperture located on cover 306 (shown in FIG. 4) and the process is repeated as needed. Although not shown, pressure and temperature sensors are located on the refrigerant manifold 104 in order to monitor the operating conditions of the evaporator 102 and make necessary adjustments to the amount and frequency of refrigerant provided to the evaporator 102.

Located in the underside of the cover 306 is a curved channel groove 312 which causes liquid refrigerant entering the evaporator via refrigerant input 308 to form a swirling pattern before it enters nozzle 310. In one embodiment, the refrigerant entering the nozzle 310 is at a pressure of about 90 PSI (pounds-per-square inch), although the pressure the refrigerant is provided will depend on the particular system requirements; pump size found in the cooling system, etc. A refrigerant swirl chamber is formed between the cover 306 and orifice plate 304, with refrigerant entering input 308 being spun into a high RPM before being sheared off by nozzle 310 and forming a fine spray or mist pattern onto the heat exchanger 302. The heat exchanger 302 includes in one embodiment a plurality of vertical pillars which helps form a heat exchanger having excellent thermal capacity for its compact size. The sprayed liquid refrigerant from nozzle 310 is immediately flashed into a gaseous state upon making contact with the hot heat exchanger 302 given that the heat exchanger 302 is in thermal contact with a DUT that is undergoing testing. This also creates a very short thermal path making very fast thermal responses possible.

Figure 4:
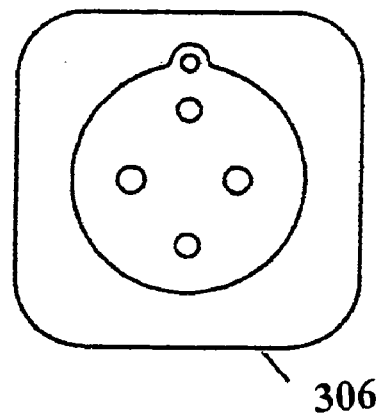
FIG. 4 shows a top view of the evaporator shown in FIG. 3 in accordance with an embodiment of the invention.

In FIG. 4, there is shown a top view of the cover 306. The smallest aperture shown is used for aligning the cover 306 to its proper attachment location in the refrigerant distribution manifold 104. Of the remaining four apertures one is the refrigerant input aperture 308, one is the refrigerant output aperture and the remaining two are preferably threaded and are used to fasten the evaporator to the distribution manifold 104. O-rings are preferably used in the input and output apertures in order to firmly seal the refrigerant entering and leaving the evaporator 102.

Figure 5:
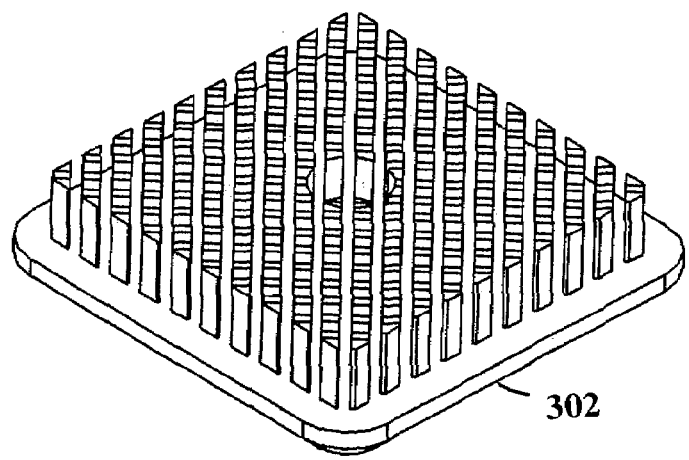
FIG. 5 shows an isometric view of a heat exchanger in accordance with an embodiment of the invention.

Referring now to FIG. 5, there is shown an isometric view of the heat exchanger 302 having first and second major sides. The first major side of the heat exchanger 302 is relatively flat and is the side that is thermally coupled to the DUT 108. In order to maximize the surface area for the liquid refrigerant to remove heat away from the heat exchanger 302, a plurality of pillars are formed extending away from the base of the heat exchanger on the second side. The greater surface area provided by the plurality of pillars helps to quickly remove heat away from the heat exchanger 302 and thus away from the DUT in a very compact area. At the center of the heat exchanger 302 is a circular cavity which is aligned with the nozzle 310 found in the orifice plate. The cavity helps evenly distribute the refrigerant spray that is being presented to the heat exchanger 302 second side via nozzle 310 and allows the sprayed refrigerant to contact as much surface area of possible. By distributing the liquid refrigerant as evenly as possible to all of the pillars and the rest of the heat exchanger's surface enclosed by cover 306, the quicker the heat is removed from the heat exchanger's surface using a very compact space.

Figure 6:
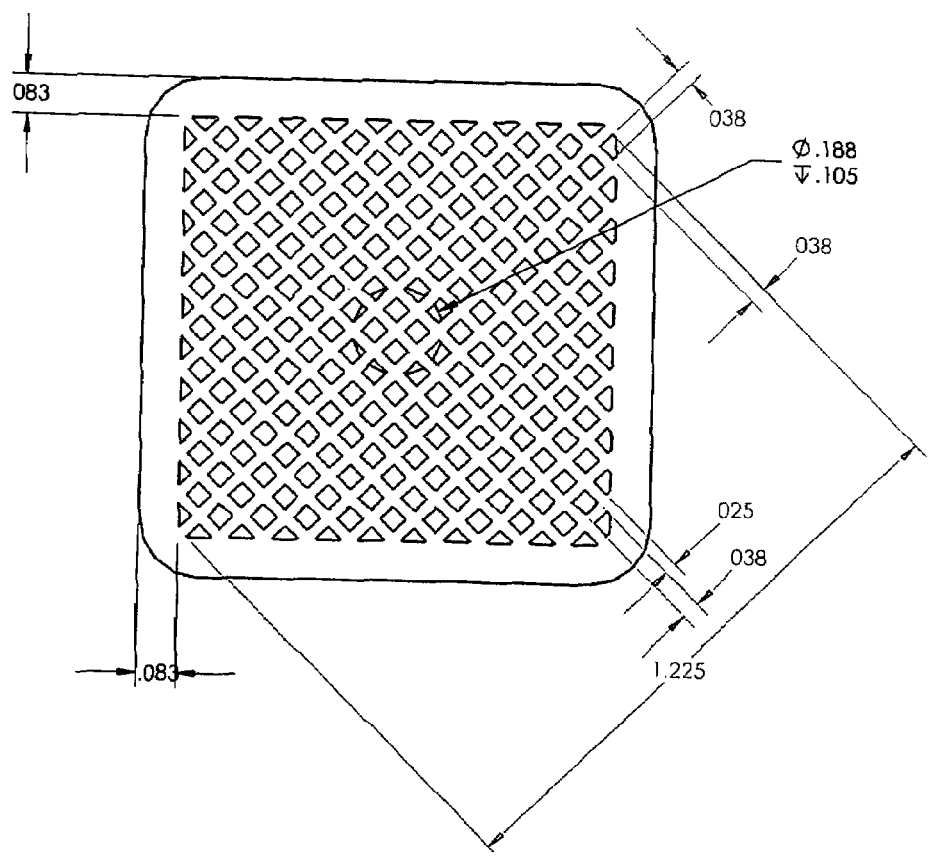
FIG. 6 shows a top view of the heat exchanger in FIG. 5 in accordance with an embodiment of the invention.
Figure 7:
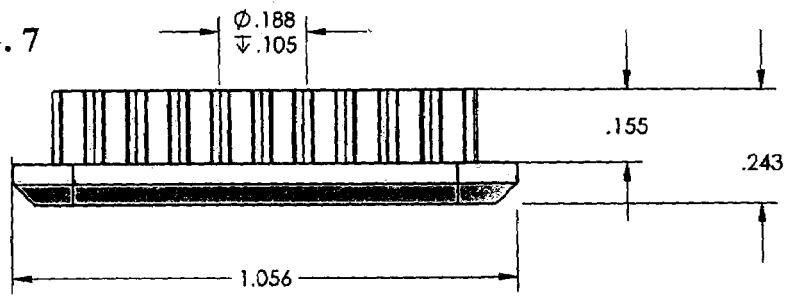
FIG. 7 shows a side view of the heat exchanger in FIG. 5 in accordance with an embodiment of the invention.

In FIG. 6 there is shown a top view of the pillar side of the heat exchanger 302. In the embodiment shown, the pillars except for the pillars along the edge have a square shape and the edge pillars have a triangular shape. The cavity or recess at the center of the heat exchanger which is preferably in alignment or in registration with nozzle 310 further improves the distribution of the sprayed refrigerant amongst all of the pillars and the rest of the heat exchanger on that side. Dimensions for one embodiment of the heat exchanger are highlighted in FIGS. 6 and 7. Different shapes and sizes for the heat exchanger and the pillars can also be used with the present invention. The pillars for example can take different exotic shapes in order to further maximize the surface area presented to the sprayed refrigerant to further maximize the heat removal from the heat exchanger 302. In the embodiment shown in FIG. 6, the plurality of pillars are evenly spaced and oriented in such a fashion that they form channels extending away from the central cavity and which are at right angles.

The heat exchanger 302 can be milled in order to form the pillars or in an alternative embodiment can be formed from a mold. The orifice plate 304 is brazed, welded or otherwise fastened to the top of the pillars. The edge margin around the entire second side of the heat exchanger that does not have pillars allows the gaseous refrigerant to exit towards the output refrigerant aperture located on cover 306 since the orifice plate 304 does not extend into the edge margin areas when fastened to the heat exchanger 302.

Figure 8:
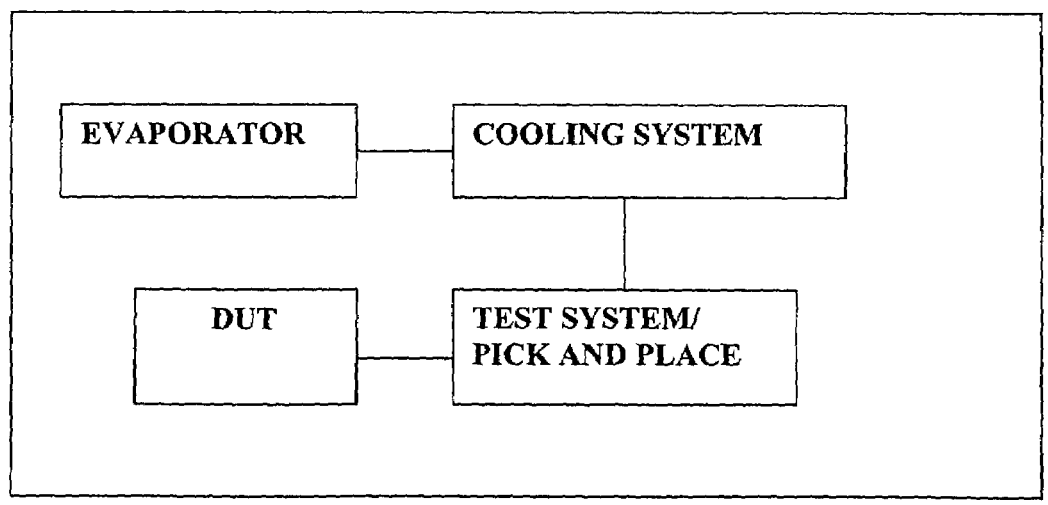
FIG. 8 shows a block diagram of a test system with DUT cooling capability in accordance with an embodiment of the invention.

In FIG. 8, there is shown a block diagram of a test system incorporating the evaporator of the present invention. Coupled to the evaporator is a cooling system that provides the liquid refrigerant to the evaporator and collects the refrigerant in a gas form from the evaporator. The cooling system also includes a test system and pick-and-place equipment that automatically places the DUT in the proper test socket and performs the needed tests on the DUT. The test system will also include a controller for controlling the cooling system and controlling the amount of refrigerant presented to the evaporator using conventional metering valves, etc.

Evaporator 302 provides for a very compact way of removing heat away from a DUT. Having a heat exchanger 302 that includes a plurality of pillars helps to increase the surface area in which the refrigerant can extract heat from the heat exchanger and away from the DUT. Although the heat exchanger 302 has been shown with pillars that extend perpendicular from the base since this helps increase the ability of the sprayed refrigerant to contact most if not all of the pillars in a fairly even fashion, the pillars can extend away from the base at other angles.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. An evaporator, comprising:
    a heat exchanger including a base member having first and second sides, the second side including a plurality of pillars extending away from the base member;
    an orifice plate located between the second side of the heat exchanger and the cover, the orifice plate includes
    a beveled aperture which forms a nozzle for spraying refrigerant onto the second side of the heat exchanger; and
    a cover for covering the second side of the heat exchanger, the cover including an input port for receiving refrigerant and located in an underside of the cover is a curved channel groove that causes refrigerant entering the input port to form a swirling pattern before it enters the nozzle.

2. The evaporator as defined in claim 1, wherein the second side of the heat exchanger includes a cavity which is aligned with the beveled aperture.

3. The evaporator as defined in claim 1, wherein the cover is fastened to the second side of the heat exchanger in order to form a closed chamber for receiving the refrigerant from the input port.

4. The evaporator as defined in claim 1, wherein the first side of the heat exchanger is flat.

5. The evaporator as defined in claim 3, wherein the cover further includes an output aperture for expelling refrigerant from the closed chamber.

6. The evaporator as defined in claim 1, wherein the evaporator is formed from cooper.

7. A cooling system for cooling a device undergoing testing, the cooling system comprising:
    an evaporator including a heat exchanger having a base member, the base member having first and second sides, the second side including a plurality of pillars extending away from the base member; and a cover for covering the second side of the heat exchanger and forming a closed chamber, the cover including an input port for providing refrigerant to the closed chamber and an output port for removing refrigerant from the closed chamber, the cover also including a curved channel groove located in an underside of the cover that causes refrigerant entering the input port to form a swirling pattern; and a refrigerant manifold coupled to the evaporator.

8. The cooling system as defined in claim 7, wherein the first side of the heat exchanger is relatively flat and is thermally coupled to the device undergoing testing in order to remove heat generated by the device.

9. The cooling system as defined in claim 7, further comprising:

an orifice plate coupled between the plurality of pillars and the cover, the orifice plate including a nozzle for spraying refrigerant into the closed chamber.

10. The cooling system as defined in claim 9, wherein the second side of the heat exchanger includes a cavity that is inline with the input port, the cavity assisting refrigerant received from the input port to be distributed about the plurality of pillars.

11. The cooling system as defined in claim 7, wherein the plurality of pillars are spaced evenly apart from each other.

12. The cooling system as defined in claim 7, wherein the plurality of pillars are spaced away from the edges of the second side.

13. The cooling system as defined in claim 7, wherein the input port provides liquid refrigerant to the closed chamber and the output port extracts gaseous refrigerant from the closed chamber.

14. The cooling system as defined in claim 7, wherein the plurality of pillars are aligned.

15. An evaporator for removing heat from devices undergoing testing, the evaporator comprising:

a cover including input and output ports, an orifice plate including a nozzle;

a heat exchanger including a plurality of pillars coupled to the orifice plate, the cover and orifice plate forming a swirl chamber for receiving refrigerant received at the input port and causing the refrigerant to swirl prior to the refrigerant being sent to the nozzle; and wherein the cover includes a curved channel groove that causes refrigerant entering the input port to form a swirling pattern before it enters the nozzle.

16. The evaporator as defined in claim 15, wherein the nozzle causes refrigerant to be sprayed onto the plurality of pillars found in the heat exchanger.

17. The evaporator as defined in claim 15, wherein the heat exchanger includes a cavity located in alignment with the nozzle.

18. The evaporator as defined in claim 16, wherein the plurality of pillars are aligned such that they form channels extending away from the cavity.

19. The evaporator as defined in claim 17, wherein the orifice plate is located atop of the plurality of pillars between the cover and the heat exchanger.

* * * * *